United States Patent

Hagenlocher

[15] 3,637,972

[45] Jan. 25, 1972

[54] METHOD AND APPARATUS FOR FORMING AN OHMIC CONTACT TO HIGH-RESISTIVITY SILICON

[72] Inventor: Arno K. Hagenlocher, Melville, N.Y.

[73] Assignee: GTE Laboratories Incorporated

[22] Filed: Apr. 1, 1970

[21] Appl. No.: 24,489

[52] U.S. Cl. ....................219/107, 29/589

[51] Int. Cl. ....................B23k 11/02

[58] Field of Search ..............219/107, 72; 29/589, 590, 584, 29/585, 59

[56] References Cited

UNITED STATES PATENTS

| | | | |
|---|---|---|---|
| 3,368,274 | 2/1968 | Brunet | 29/589 |
| 2,510,322 | 6/1950 | Shearer | 29/585 |
| 3,256,598 | 6/1966 | Kramer et al. | 29/589 UX |

*Primary Examiner*—J. V. Truhe
*Assistant Examiner*—Hugh D. Jaeger
*Attorney*—Irving M. Kriegsman

[57] ABSTRACT

A method of forming an ohmic contact between a conductor and a silicon substrate having a resistivity greater than 5 ohm-cm. by etching the substrate, heating it in an atmosphere of inert gas, pressing the conductor into contact with the substrate, and allowing sufficient current to flow through the conductor and the substrate to form the contact.

6 Claims, 2 Drawing Figures

PATENTED JAN 25 1972 3,637,972

INVENTOR.
ARNO K. HAGENLOCHER

R. J. Frank
ATTORNEY.

METHOD AND APPARATUS FOR FORMING AN OHMIC CONTACT TO HIGH-RESISTIVITY SILICON

BACKGROUND OF THE INVENTION

This invention relates to a method for bonding a conductor to silicon and in particular to a method of forming an ohmic contact between a conductor and a high resistivity silicon substrate. High resistivity silicon is defined as silicon having a resistivity greater than 5 ohm-cm.

Generally the bonding process requires that a suitable conductor be brought into contact with a semiconductor material and a connection made by the application of heat. In the alloy method of bonding, heat is supplied by passing an electric current through the conductor and semiconductor material until a bond is formed. While alloy bonding has been used successfully with germanium, attempts to alloy conductors to low or high resistivity silicon has produced bonds which are brittle and can stand very little stress. In addition, the alloying process has proved to be difficult to control with the alloyed area tending to spread out over the silicon substrate beyond desirable dimensions thus making it difficult to obtain multiple contacts.

These difficulties have led researchers to seek a different method of bonding conductors to silicon. One method commonly employed for joining a conductor to low resistivity silicon is thermocompression bonding. Bonding is accomplished by pressing the conductor onto the silicon substrate while maintaining the conductor and the substrate at an elevated temperature. However when the semiconductor material is high resistivity silicon, the thermocompression bonding method does not provide the required bond.

With the development of devices such as space-charge-limited diodes and triodes which use high resistivity silicon, it became necessary to develop a technique for joining a conductor to high resistivity silicon. One method, employs a nickel coated lead plate and a gold plate placed between a body of high resistivity silicon and a gold coated conductor. The parts are pressed together at 530° C. causing a quaternary alloy of gold, lead, tin and nickel to be formed between the silicon body and the conductor thus providing a bond between them. This method is relatively complex and requires materials which have been carefully manufactured. In addition, the relatively high temperature to which the entire silicon body is exposed can cause a change in the electrical properties of the silicon. Accordingly, I have invented a method of forming an ohmic contact between a conductor and high resistivity silicon substrate which is relatively simple and produces a bond as strong as the conductor. This method permits the bond to be formed with the temperature of the entire silicon substrate raised to a relatively low temperature thereby decreasing the possibility of changing the electrical properties of the silicon substrate and enabling successive contacts to be formed in a small area.

SUMMARY OF THE INVENTION

According to the present invention, an ohmic contact is formed between a conductor and a silicon substrate having resistivity greater than 5 ohm-cm. by heating the silicon substrate, surrounding it with an atmosphere of inert gas and then pressing the conductor into contact with the substrate. A voltage source is then coupled between the conductor and the silicon substrate so as to provide a potential difference therebetween until an ohmic contact is formed.

BRIEF DESCRIPTION OF THE DRAWING

The invention and its other objects and features will be more readily understood from a consideration of the following description taken in connection with the drawings.

DESCRIPTION OF THE PREFERRED EMBODIMENT

Figure 1:
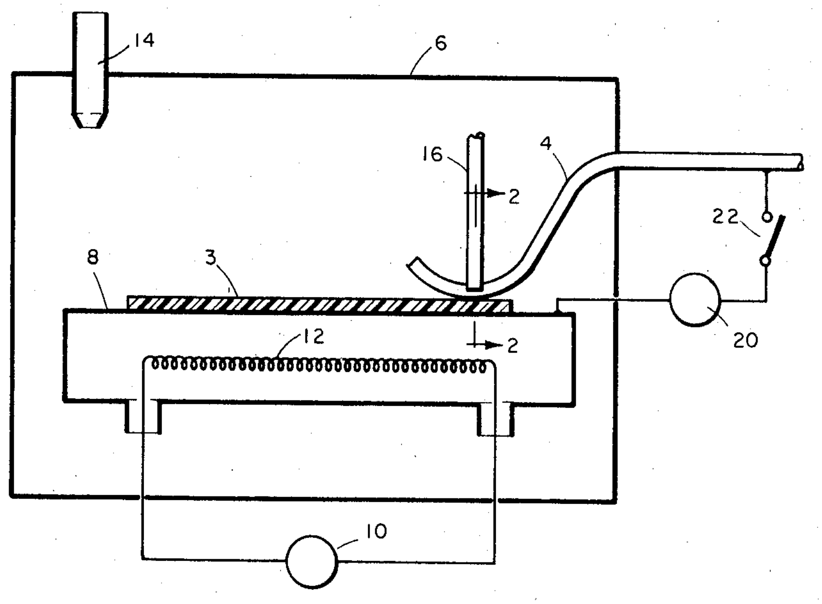
FIG. 1. is a representation of the apparatus used in bonding a conductor to a silicon substrate.

Referring now to FIG. 1, there is shown a substrate of high resistivity silicon 3 having a correspondingly low doping concentration. High resistivity silicon is defined as silicon having a resistivity greater than 5 ohm-cm. Silicon having P-type conductivity and a resistivity of 5 ohm-cm. can be obtained by doping with boron atoms to a concentration of about $5\times10^{14}$ atoms/cm$^3$. The maximum resistivity of silicon obtainable by a reproducible process is limited to about 50,000 ohm-cm. corresponding, for example, to a boron concentration of about$3\times10^{11}$ atom/cm$^3$. Silicon having a resistivity greater than 50,000 ohm-cm. is difficult to produce reliably using present semiconductor manufacturing techniques due to problems in controlling the interaction between the dopant and semiconductor as the dopant concentration is lowered. Similar resistivity characteristics are exhibited by silicon of N-type conductivity.

To form an ohmic contact between a conductor 4 and the silicon substrate 3 in accordance with the present invention, the silicon substrate is first etched by any of the various well known etching processes. For example, the substrate can be immersed for about 3 minutes in a solution (commonly referred to as CP4) consisting of 5 parts of volume of concentrated nitric acid, 3 parts by volume of 48 percent hydrofluoric acid, 3 parts of volume of glacial acetic acid and liquid bromide in ratio of 10 drops per 50 cm.$^3$ of the acid mixture. The substrate is next placed inside container 6 in electrical and thermal contact with metal support plate 8 which is then heated by application of a voltage from voltage source 10 to heating coil 12. Silicon substrate 3 is heated to a temperature between 90° and 140° C., the exact temperature within this range not being critical. It has been found that if the temperature of the silicon substrate is below 90° C. an ohmic contact cannot be formed and if the temperature of the silicon is above 140° C., the silicon substrate may be damaged during the subsequent bonding operation.

After the desired temperature has been reached, or while the substrate is being heated, an inert gas such as argon or nitrogen is fed into container 6 through nozzle 14 until the silicon substrate is completely surrounded by the gas. At this time the flow of gas may be stopped, nozzle 14 removed from the container and the container sealed to prevent leakage of the inert gas. Alternatively, a stream of inert gas which has been heated so as to prevent cooling of the substrate is made to flow continuously over and surround the area of the substrate on which the bond is to be formed. By using a continuous stream of inert gas during the entire bonding operation, the necessity of bonding within a closed container is eliminated.

Figure 2:
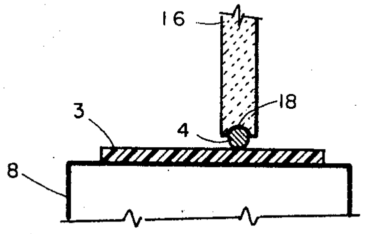
FIG. 2. is a sectional view taken along 2—2 of FIG. 1.

When the silicon substrate has reached the required temperature and has been completely surrounded by the inert gas, a portion of conductor 4 adjacent the end thereof is pressed into contact with silicon substrate 3 by probe 16, a pressure of about 40 grams having been found to provide good bonding. Conductor 4 is preferably a gold or an aluminum wire. Probe 16 may be composed of any hard, insulating material which does not react with the silicon substrate or the conductor, and preferably is made of sapphire. Referring to FIG. 2, the end of probe 16 has an arcuate-shaped center portion 18 having a diameter somewhat smaller then the diameter of conductor 4. Alternatively, the end of probe 16 could be formed into a wedge or have any other shape used for thermocompression bonding.

A source of voltage 20, in series with switch 22, which may, for example be a circuit breaker, is coupled between conductor 4 and metal support plate 8, the polarity of voltage source 20 not being critical. When switch 22 is closed current flows through conductor 4 and substrate 3. Initially the magnitude of the current is small because of the high resistivity of the silicon substrate. However, the flow of current heats a region of the substrate adjacent to the conductor causing a rapid drop in the resistivity of the substrate in that region and a rapid increase in the magnitude of the current. Therefore care must be exercised to prevent damage to the conductor and substrate caused by excessive heating. Bonds have been formed by using a voltage source which supplies a voltage having a magnitude which may be varied between 30–60 volts DC and by limiting the current to 200 milliamperes.

To form an ohmic contact between a gold wire having a diameter of 2 mils and a silicon substrate having a resistivity of 40,000 ohm-cm. and a thickness of 20 mils, the substrate is first etched in a solution of CP4 and then placed on a metal plate inside a closed container. The substrate is heated to a temperature of 100° C. while argon is introduced into the container until the substrate is completely surrounded by the gas. A sapphire probe having a shape as shown in FIG. 2, is positioned adjacent the end of the gold wire and a pressure of 40 grams applied to the probe to press the wire into contact with the substrate. A DC voltage source having a magnitude of 40 volts connected in series with a circuit breaker is coupled between the gold wire and the silicon substrate. The circuit breaker is actuated when the current reaches 200 milliamperes.

Voltage source 20 may alternatively be a pulse generator which provides a voltage pulse having an amplitude between 30 and 60 volts and a duration of 1–10 milliseconds between the wire and the substrate when switch 20 is closed. The precise pulse amplitude and duration for a particular wire and substrate will depend on the thickness and resistivity of the silicon substrate and its temperature.

I claim:

1. A method for forming an ohmic contact between a conductor and silicon substrate of resistivity greater than 5 ohm-cm. comprising the steps of a. heating said silicon substrate to a temperature between 90° C. and 140° C., b. surrounding the surface of said silicon substrate in the region where said ohmic contact is to be formed with an atmosphere of inert gas, c. pressing said conductor into contact with the silicon substrate in said region, d. coupling a voltage source directly to said silicon substrate and said conductor whereby current flows through said substrate and said conductor, and e. removing said voltage source when said ohmic contact is formed.

2. The method of claim 1 wherein the entire surface of said silicon substrate is surrounded by an atmosphere of inert gas.

3. The method of claim 2 including the additional step of monitoring the current flow through said conductor and said substrate after said voltage is applied therebetween, said voltage being removed when said current reaches 200 milliamperes.

4. The method of claim 2 wherein said voltage is applied between said conductor and said substrate for a duration of between 1–10 milliseconds.

5. A method for forming an ohmic contact between a metallic wire and a silicon substrate having resistivity greater than 5 ohm-cm. comprising the steps of a. heating said silicon substrate to a temperature of about 100° C., b. surrounding said silicon substrate with an atmosphere of inert gas, c. pressing said wire into contact with said silicon substrate, d. coupling a source of DC voltage between said wire and said silicon substrate, said voltage source providing a voltage having a magnitude of 40 volts, e. monitoring the resultant current flow, and f. interrupting the flow of current when said current reaches 200 milliamperes.

6. The method of claim 1 wherein said voltage source has a potential between 30–60 volts DC.

* * * * *